United States Patent
Chien

(10) Patent No.: US 7,181,662 B2
(45) Date of Patent: Feb. 20, 2007

(54) ON-CHIP TEST APPARATUS

(75) Inventor: Jinn-Yeh Chien, Chung Lei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 419 days.

(21) Appl. No.: 10/789,300

(22) Filed: Feb. 26, 2004

(65) Prior Publication Data
US 2005/0193296 A1    Sep. 1, 2005

(51) Int. Cl.
G01R 31/28    (2006.01)
G11C 19/00    (2006.01)

(52) U.S. Cl. .......................... 714/724; 377/64

(58) Field of Classification Search ............... None
See application file for complete search history.

(56) References Cited

U.S. PATENT DOCUMENTS

| | | | | |
|---|---|---|---|---|
| 5,907,562 | A | * | 5/1999 | Wrape et al. ............... 714/726 |
| 5,983,380 | A | * | 11/1999 | Motika et al. .............. 714/733 |
| 6,934,900 | B1 | * | 8/2005 | Cheng et al. ............... 714/738 |
| 6,950,974 | B1 | * | 9/2005 | Wohl et al. ................. 714/733 |

* cited by examiner

Primary Examiner—Christine T. Tu
(74) Attorney, Agent, or Firm—Tung & Associates

(57) ABSTRACT

Testing of on-chip test structures is accomplished by employing a test apparatus that allows test data to be uploaded into selected data latches associated with respective ones of a plurality of test structures. Tests are performed by selectively providing a test data from the data latch to the associated test structure. Test results may be registered into an adjacent data latch for downloading. Multiple test structures may thereby be tested using only limited probing pad access and wafer area.

9 Claims, 4 Drawing Sheets

ON-CHIP TEST APPARATUS

TECHNICAL FIELD

The present invention is generally related to microchips and their fabrication. More particularly, the invention relates to performing on-chip testing of test structures.

BACKGROUND OF THE INVENTION

It is conventional practice in a semiconductor fabrication enterprise to provide test structures, reference elements, or monitoring elements (hereafter all referred to as test structures) on-chip for the purpose of taking parametric and functional measurements. Such measurements may be taken as part of the circuit and process design or as part of a check on process parameters for feedback into the fabrication process as part of an overall production process control strategy. As used herein, chip may refer to a semiconductor wafer or portion thereof of interest in the testing of parametric and/or circuit characteristics. Regions of interest may include particular representative wafer areas, all or select die area, scribe lines or kerfs or other unused wafer portions, etc. Such methodology has become important and commonplace in the development and control of the fabrication process which includes numerous and varied steps and process parameters.

With reference first to FIG. 1 a portion of a semiconductor chip 10 is illustrated having built-in or on-chip test structures 11. Test structures are fabricated during the regular course of process development or production processing utilized to fabricate the desired end product device. These test structures are checked, depending upon test structure, for functional or parametric compliance with desired results. Access for testing is accomplished by expensive, precision probing machinery that steps through the various test structures by contacting probing pads 13. With ever decreasing structure scales and ever increasing device densities which typify the industry, the probing pads have come to undesirably occupy ever increasing proportional areas 15 of the overall wafer floor plan. It is not practical nor cost effective to further miniaturize the external probing machinery and equipment which in turn would allow miniaturization of the contact probing areas on-chip.

SUMMARY OF THE INVENTION

Therefore, it is one object of the present invention to provide an on-chip test apparatus for testing structures.

It is a further object of the present invention to provide such a test apparatus which consumes only limited wafer area.

It is a further object of the present invention to provide such a test apparatus which requires only limited probing pads and only limited external electrical access.

These objects and advantages of the present invention are realized by an on-chip test apparatus including at least one test stage and preferably a plurality of test stages. Each test stage corresponds to an associated test structure characterized by an input and output. Each test stage includes a data latch fabricated on-chip and having a data latch input and a data latch output. Means are provided to selectively couple test data directly to data latches of subsequent test structures in a data upload mode or through the test structure in a test mode.

In a preferred embodiment the means for selective coupling of test data includes a first multiplexer having a respective pair of inputs and an output, a second multiplexer having a respective pair of inputs and an output. One of the pair of inputs to the first multiplexer is the output from the data latch and the other of the pair of inputs to the first multiplexer is the inverted output from the data latch. The first multiplexer output is coupled to the input of the test structure and to one of the pair of inputs to the second multiplexer. The other of the pair of inputs to the second multiplexer is coupled to the output of the test structure. The output from the second multiplexer may be provided to an additional data latch which may be a data latch of a subsequent test stage.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
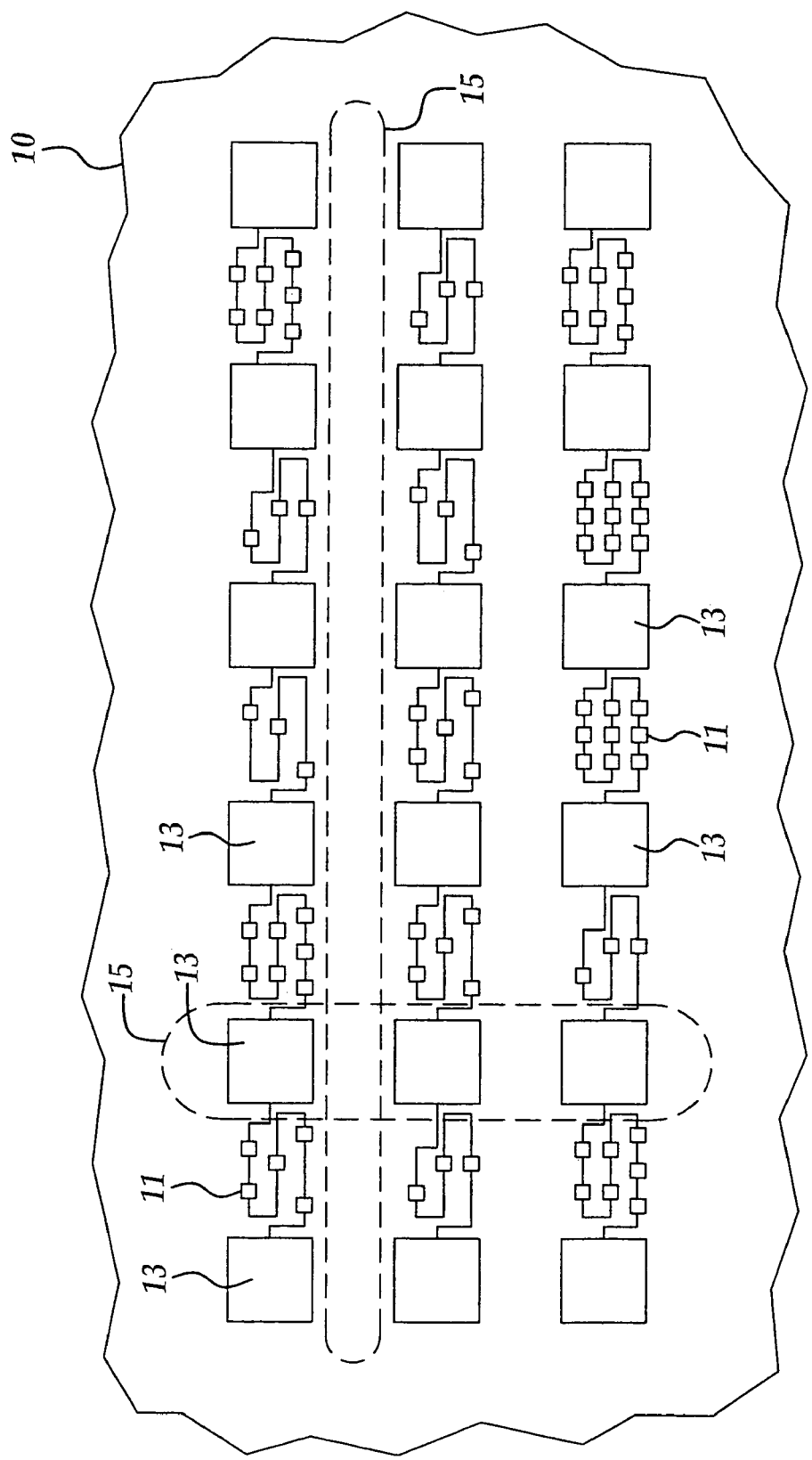
FIG. 1 is a conventional schematic layout floor plan including probing pads and test structures for on-chip testing of structures exemplifying shortfalls of the prior art.
Figure 2:
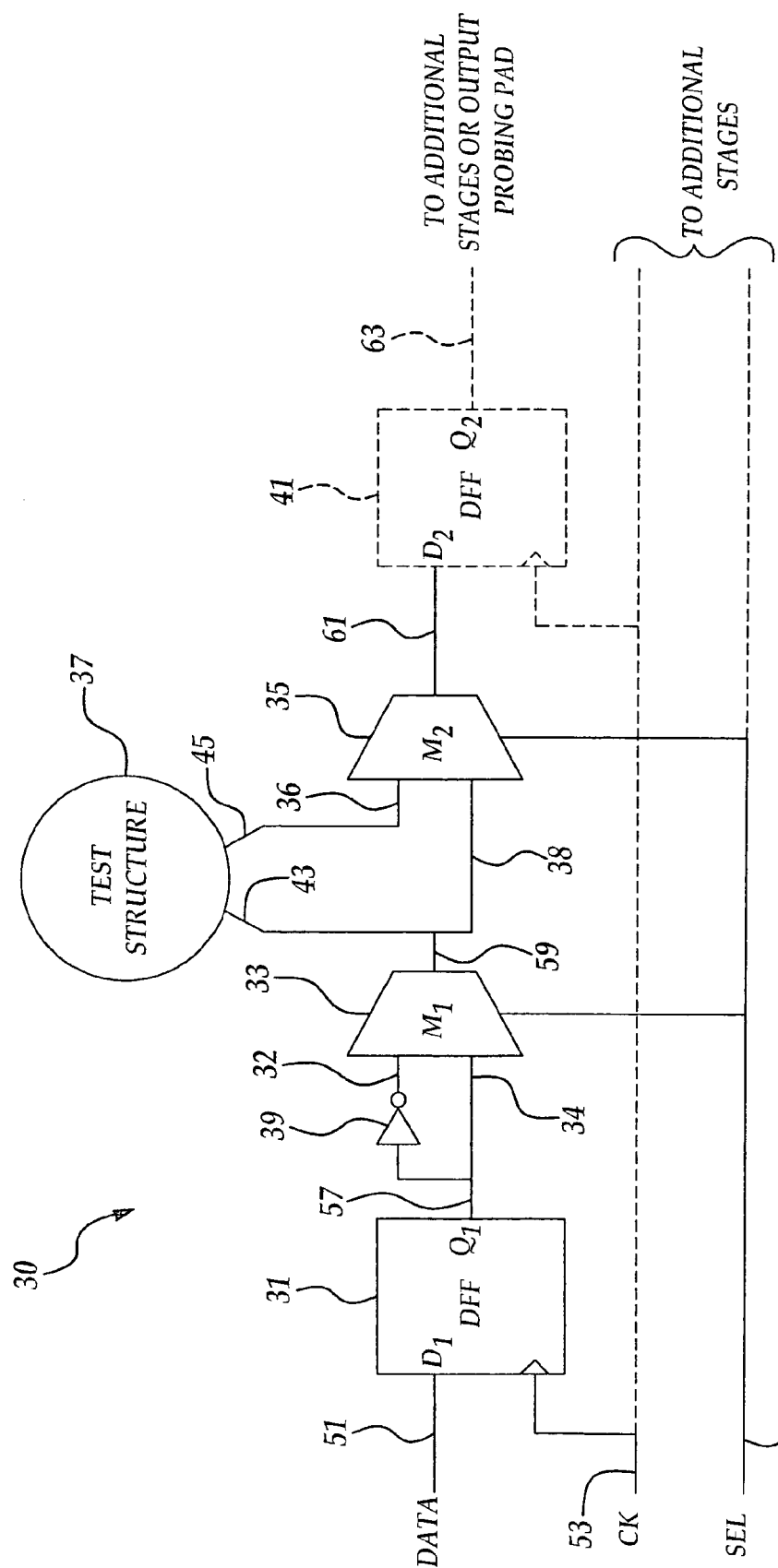
FIG. 2 is a schematic diagram of a single stage preferred embodiment of an on-chip test apparatus in accordance with the present invention.

With reference now to the schematic diagram of FIG. 2, a single stage preferred embodiment of an on-chip test apparatus in accordance with the present invention is illustrated. The single stage illustrated may be concatenated or strung together with like stages to provide for a multi-stage on-chip test apparatus as exemplified in the schematic diagram of FIG. 4. The basic building block of a multi-stage apparatus is represented by the solid lines of FIG. 2. Where features appear illustrated with broken lines, those features may represent additional preferred features or features necessarily forming part of a multi-stage apparatus as will become more clear with continued explanation.

Test structure 37 is a two terminal structure having an input 43 and an output 45. A variety of test structures are contemplated for application with the present invention including: metal and polysilicon chain patterns (single and multi-level), via chain patterns, circuit elements (transistors, diodes, resistors, capacitors), logic gate chains (and, nand, or, nor, inverters, and combinational logic), etc. Such basic and varied test structures in combination with the present on-chip test apparatus may be useful in diagnosing and quantifying variations in conductivity, dopant concentrations, thickness variations in layers and structures, leakage paths, shorts, opens, interspacing issues, resistance issues, mask misregistrations, propagation delays, contaminations, stress migration, or other soft and hard faults or defects. The particular type of test structure is not considered to be limiting to the present invention in any way. In fact, the present invention is intended to be applicable to any of the variously listed types of test patterns and other test patterns not explicitly listed herein.

A test apparatus 30 in accordance with the present invention includes a data latch 31, preferably a D-type flip-flop (DFF), a first 2-1 multiplexer $M_1$ 33, a second 2-1 multiplexer $M_2$ 35, and test structure 37. Multiplexers $M_1$ and $M_2$ (33, 35) each have respective first and second mux inputs corresponding to lines 32,34 and lines 36,38 and mux outputs corresponding to lines 59 and 61. Mux input line 32 is preferably coupled to an inverted 39 output $\overline{Q}_1$ of data latch 31 by line 57 and mux input line 34 is coupled to an output $Q_1$ of data latch 31 by line 57. While shown as an inverted signal external to data latch 31, it will be recognized that such inverted outputs are commonly generated as an output of such data latches directly. Mux output line 59 is coupled to test structure 37 input 43 and mux input line 38. Mux input line 36 is coupled to the test structure 37 output 45. Mux input lines 34 and 38 are utilized selectively during data loading and unloading cycles to pass data directly between the various data latches that make up single and multi-stage test structures of the present invention. Such data passing is in bypass of any test structure 37 and may include loading of data into desired data latches and unloading of data out of desired data latches. Mux input lines 32 and 36 are utilized selectively during test cycles to provide test data to the test structure 37 and to acquire test data from the test structure 37, respectively. In this functional regard, certain tests may benefit from a different type of test data signal than may be provided for in the present arrangement wherein mux line 32, the test data input line, is simply the inverted output from data latch 31. Hence, it is envisioned that mux line 32 may be coupled to an alternative source of test signal, for example a digital test signal that may be preceded by some conditioning input signal characterized by high frequency switching content.

Multiplexers $M_1$ 33 and $M_2$ 35 are selectively controlled by the logic state of SEL line 55 which may be coupled through a probing pad (not shown) to an external selection signal generator. Data latch is clocked by CK line 53 which may be coupled through a probing pad (not shown) to an external clock signal generator. DATA line 51, which may be coupled through a probing pad (not shown) to an external data signal generator, provides during an upload cycle test data to data latch 31 for use in a test cycle in the testing of test structure 37 in a single stage application. Alternatively, DATA line 51 provides during an upload cycle test data to data latch 31 for shift propagation to subsequent data latches (such as data latch 41) associated with subsequent test stages for testing of test structures associated with such subsequent test stages. In such a case, data latch 41 is analogous to data latch 31 in its function in further propagation or testing of an associated test structure (not shown) analogous to test structure 37. Alternatively, the various logic utilized in providing the data, clock and selection signals may be incorporated on-chip as part of a built-in-self-test (BIST).

Figure 3:
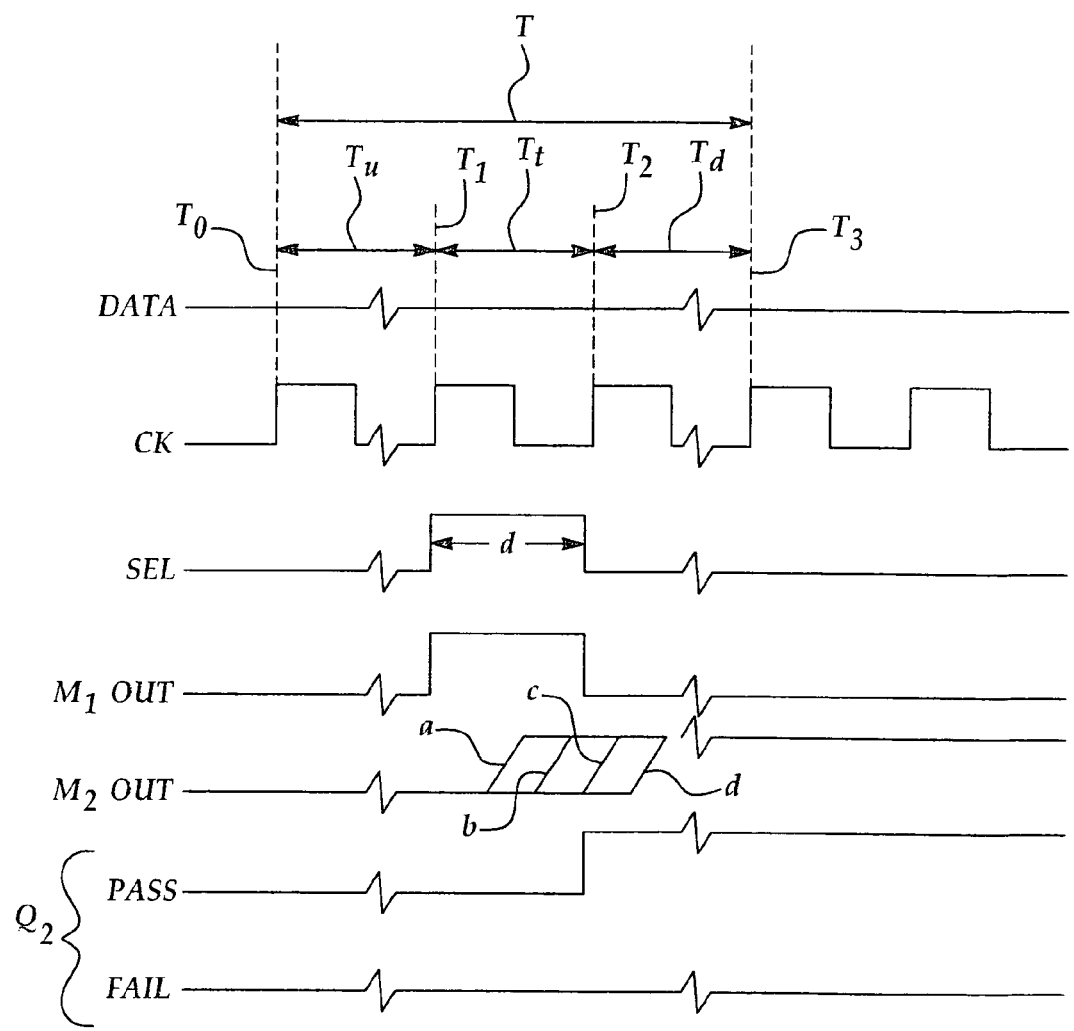
FIG. 3 is an exemplary timing diagram useful in explanation of single and multi-stage preferred embodiments of an on-chip test apparatus in accordance with the present invention; and, FIG. 4 is a schematic diagram of a multi-stage preferred embodiment of an on-chip test apparatus in accordance with the present invention.

With further reference to the timing diagram of FIG. 3. in conjunction with FIG. 2, a single stage test is further described. An overall cycle T includes data upload cycle $T_u$, test cycle $T_t$ and data download cycle $T_d$. Data upload cycle $T_u$ corresponds to a time $t_0$ roughly at a first positive edge of CK signal to a time $t_1$ roughly at a subsequent positive edge of CK signal. Test cycle $T_t$ corresponds to time $t_1$ to a time $t_2$ roughly at a next subsequent positive edge of CK signal. And, data download cycle $T_d$ corresponds to time $t_2$ to a time $t_3$ roughly at a subsequent positive edge of CK signal. Variation in time or clock cycles for multi-stage testing is recognized and illustrated by the discontinuity symbology on each of the various signals illustrated in the timing diagram of FIG. 3.

First, an exemplary low DATA signal is provided on line 51 to the $D_1$ input of data latch 31. At the inception of the data upload cycle $T_u$, the rising CK signal provided on line 53 causes data latch to register and hold the low DATA signal as $Q_1$ and provide same to line 57. Meanwhile, an exemplary low SEL signal has been provided on line 55 which effectively selects mux inputs 34 and 38 thereby directly coupling data latch 31 output $Q_1$ through multiplexers $M_1$ 33 and $M_2$ 35 to line 61 (see $M_1$ out and $M_2$ out in FIG. 3). The data loaded into data latch 31 may alternately be a high DATA signal. The logic level of the DATA signal to be clocked into data latch 31 is determined by the desired test data to be provided to the test structure 37 during the test cycle $T_t$.

Following the data upload cycle $T_u$, the test cycle $T_t$ is executed. It is during the test cycle that the test structure 37 is provided with a digital test signal at its input 43. In the present embodiment this is accomplished by toggling the SEL signal on line 55 which couples the inverted 39 output $\overline{Q}_1$ of data latch 31 to the input 43 of test structure 37. Similarly, this toggling of SEL signal on line 55 couples the output 45 of test structure 37 through mux $M_2$ 35 to line 61. The test structure 37 will exhibit some finite delay before the output 45 thereof exhibits an expected state change. Such delay can be quantified for specific test structures and accounted for in terms of an acceptable time response. The acceptable time response is embodied in the duration of the toggled SEL signal. Since the initial toggling of the SEL signal essentially initiates the provision of the test signal to the test structure 37 input 43, and the SEL signal toggled duration d defines the acceptable response window, a state change occurring at the output 45 of test structure 37 during the SEL signal toggled state is inferred to be an acceptable response or passed test. It is convenient and desirable, however, to register or capture the test structure 37 output 45 state. This is accomplished by data latch 41 in conjunction with a CK period signal that closely corresponds to the SEL signal toggled duration d. It may be recognized that the DATA signal that is clocked into the data latch 31 at the positive edge of CK signal corresponding to the test cycle $T_t$ is the data which provides the basis for the test signal to be provided to the input 43 of test structure 37. Therefore, for a single stage test structure a separate upload cycle is not absolutely required. However, to ensure stability it is good practice to initiate SEL signal toggling at some predetermined time $t_1^+$ subsequent to the positive edge of CK signal corresponding to the test cycle $T_t$. Similarly, to ensure stability it is good practice to ensure that any capture of test structure 37 output 45 state is accomplished wherein the end of the toggled state of SEL signal occurs at some predetermined time $t_2^+$ subsequent to the positive edge of CK signal corresponding to the data download cycle $T_d$.

With the previous explanation of FIGS. 2 and 3 in mind, the portion of the timing diagram of FIG. 3 labeled $M_2$ out shows a variety of possible test results labeled a, b, c, and d designating test structure 37 output 45 state changes at various times in relation to the test cycle $T_t$. Labels a and b correspond to output 45 state changes that fall within the acceptable window established by the SEL signal and hence a passed test. Such a passed test is registered upon the positive edge of CK signal corresponding roughly to time $t_2$ whereat the mux $M_2$ 35 output on line 61 ($M_2$ out in FIG. 3) present at input $D_2$ is clocked into the data latch 41 ($Q_2$ in FIG. 3). In contrast, Labels c and d correspond to output 45 state changes that fall outside the acceptable window established by the SEL signal and hence a failed test. Such a failed test is registered upon the positive edge of CK signal corresponding roughly to time $t_2$ whereat the multiplexer $M_2$ 35 output on line 61 ($M_2$ out in FIG. 3) present at input $D_2$ is clocked into the data latch 41 ($Q_2$ in FIG. 3).

Figure 4:
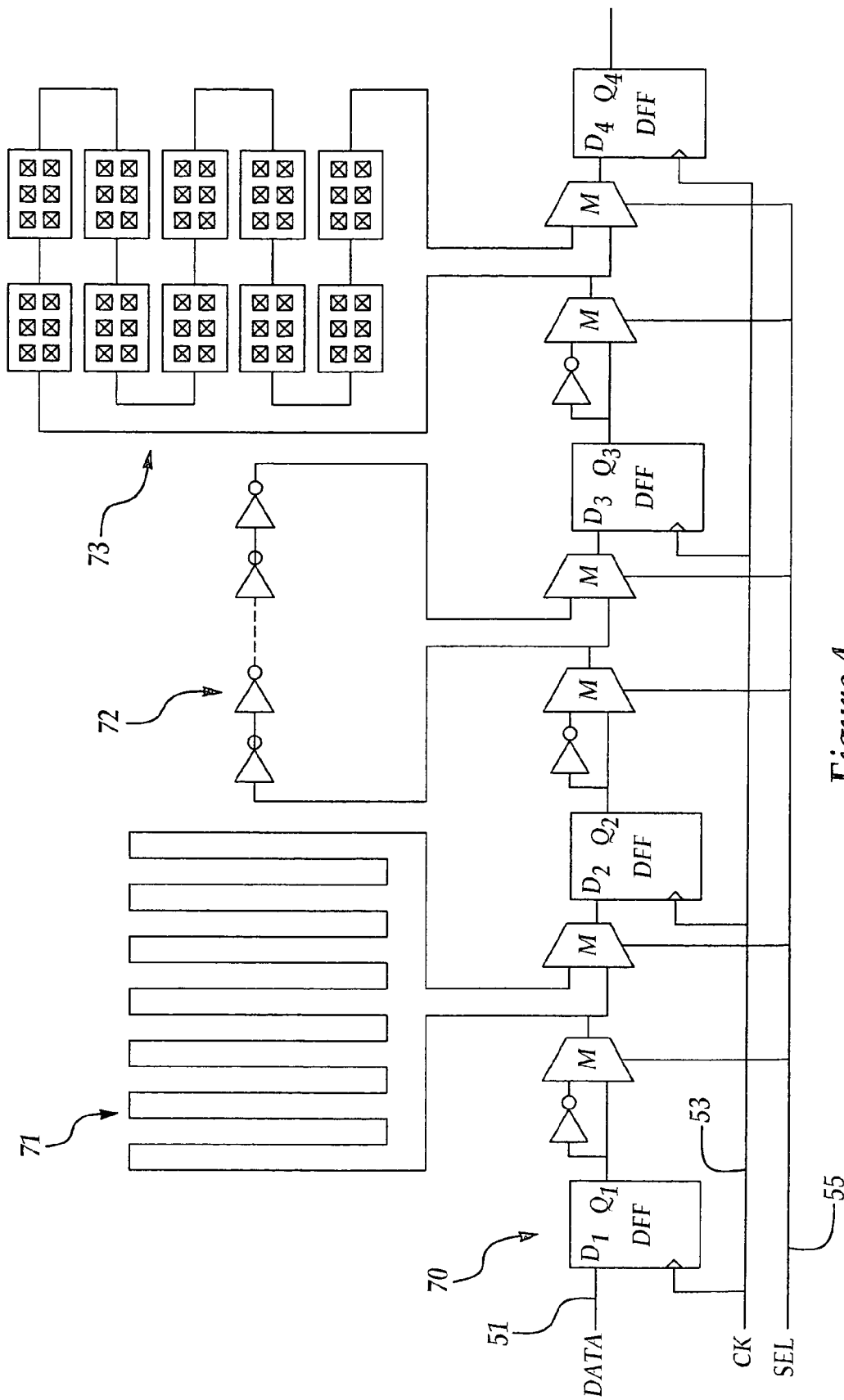

FIG. 4 is a further illustration of a multi-stage test apparatus 70 comprising a plurality of like individual stages as shown in FIG. 2. Here it can be plainly seen that adjacent data latches (DFF) may selectively be operated in serial shift register fashion. SEL line 55 when held low provides such operation. As alluded to previously, data may be loaded into any given data latch or latches based upon the number of clock cycles and corresponding sequence of DATA line 51 data. For example, holding DATA line 51 low for four consecutive clock cycles on CK line 53 will place all data latch outputs $Q_1$–$Q_4$ to a logic low state. This may in some instances be considered a starting state similar to a reset function without the additional floor plan overhead of another control line and corresponding probing pad.

A variety of exemplary test structures are also illustrated in conjunction with the apparatus of FIG. 4. A serpentine metal chain 71, an inverter chain 72 and a via chain 73 are shown. Each of such diverse types of test structures will likely require different testing protocols. Hence, it is possible with the present invention to upload data into a selected data latch, perform a test in accordance with a selected protocol and thereafter down load the test results data from the subsequent data latch. The protocol is generally established then by changing the test window established by the SEL line signal and the period of the CK line signal, which signals may be adapted and changed for the particular test structure under test. Test structures that have the same protocol may be tested in parallel with the present apparatus by loading respective data latches, performing tests and unloading the data stream. Alternatively, it is envisioned that data may be read out of the data latches in parallel form. Such alternative would of course require additional parallel output lines associated with each data latch output $Q_1$–$Q_4$.

The invention has been described with respect to certain preferred embodiments intended to be taken by way of example and not by way of limitation. Certain alternative implementations and modifications may be apparent to one exercising ordinary skill in the art. Therefore, the scope of invention as disclosed herein is to be limited only with respect to the appended claims.

What is claimed is:

1. An on-chip test apparatus comprising:
    a first and a second data latch fabricated on-chip, each of said first and second data latches having a respective input and a respective output;
    a test structure fabricated on-chip; and
    a selective coupling means for selectively coupling the output of the first data latch to the input of the second data latch either directly or through the test structure, the selective coupling means including
        a first multiplexer having a pair of first mux inputs and a first mux output, and
        a second multiplexer having a pair of second mux inputs and a second mux output,
        one of said pair of first mux inputs coupled to the first data latch output, the first mux output coupled to an input of the test structure and one of said pair of second mux inputs, the other of said pair of second mux inputs coupled to an output of the test structure, the second mux output coupled to the second data latch input.

2. The on-chip test apparatus as claimed in claim 1 wherein the other of said pair of first mux inputs is coupled to an inverted first data latch output.

3. The on-chip test apparatus as claimed in claim 1 wherein the other of said pair of first mux inputs is coupled to a predetermined test signal.

4. The on-chip test apparatus as claimed in claim 3 wherein the predetermined test signal comprises an inverted first data latch output.

5. An on-chip test apparatus comprising:
    a first and a second data latch fabricated on-chip, each of said first and second data latches having a respective input and a respective output;
    test structure fabricated on-chip;
    a first multiplexer having a pair of first mux inputs and a first mux output;
    a second multiplexer having a pair of second mux inputs and a second mux output; and
    one of said pair of first mux inputs coupled to the first data latch output, the other of said pair of first mux inputs coupled to an inverted first data latch output, the first mux output coupled to an input of the test structure and one of said pair of second mux inputs, the other of said pair of second mux inputs coupled to an output of the test structure, the second mux output coupled to the second data latch input.

6. A multistage on-chip test apparatus comprising:
    a test stage comprising:
        a data latch fabricated on-chip, said data latch having a data latch input and a data latch output;
        a test structure fabricated on-chip, said test structure having a test input and a test output;
        a first multiplexer having a pair of first mux inputs and a first mux output;
        a second multiplexer having a pair of second mux inputs and a second mux output;
        one of said pair of first mux inputs coupled to the data latch output and the other of said pair of first mux inputs coupled to an inverted data latch output, the first mux output coupled to the test input and to one of said pair of second mux inputs, the other of said pair of second mux inputs coupled to the test output.

7. The on-chip test apparatus as claimed in claim 6 wherein a plurality of test stages are concatenated such that a subsequent test stage data latch input is coupled to a preceding test stage second mux output.

8. An on-chip test apparatus comprising:
    an n-bit shift register fabricated on-chip, said shift register including n data latches;
    n-1 test structures fabricated on-chip; and
    selective coupling means associated with each pair of adjacent data latches for selectively coupling adjacent data latches either directly or via a respective test structure, wherein loading and unloading of test data occurs when the adjacent data latches are coupled directly and testing of the test structures occurs when the adjacent data latches are coupled through the test structures,
    each of said selective coupling means including
        a first multiplexer having a pair of first mux inputs and a first mux output, and
        a second multiplexer having a pair of second mux inputs and a second mux output, wherein one of said pair of first mux inputs coupled to a first data latch output, the other of said pair of first mux inputs coupled to an inverted first data latch output, the first mux output coupled to an input of a respective one of the test structures and one of said pair of second mux inputs, the other of said pair of second mux inputs coupled to an output of the respective one of the test structures, the second mux output coupled to a second data latch input.

9. A method for conducting an on-chip test on an IC chip, comprising the steps of:

providing an IC chip;

fabricating a first and a second data latch on said IC chip, each of said first and second data latches having a respective input and a respective output;

fabricating a test structure on said IC chip;

providing a selective coupling means for selectively coupling the output of the first data latch to the input of the second data latch either directly or through the test structure, the selective coupling means including a first multiplexer having a pair of first mux inputs and a first mux output, and a second multiplexer having a pair of second mux inputs and a second mux output;

coupling one of said pair of first mux inputs to the first data latch output;

coupling the first mux output coupled to an input of the test structure and one of said pair of second mux inputs;

coupling the other of said pair of second mux inputs to an output of the test structure; and, coupling the second mux output to the second data latch input.

* * * * *